(12) United States Patent
Huang et al.

(10) Patent No.: US 10,199,114 B2
(45) Date of Patent: Feb. 5, 2019

(54) STRESS DETECTION IN A FLASH MEMORY DEVICE

(71) Applicant: QUALCOMM Incorporated, San Diego, CA (US)

(72) Inventors: I-Heng Huang, San Diego, CA (US); Benish Babu, San Diego, CA (US); Steven Haehnichen, San Diego, CA (US); Robert Coleman, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 15/607,422

(22) Filed: May 26, 2017

(65) Prior Publication Data

US 2018/0342306 A1    Nov. 29, 2018

(51) Int. Cl.
| | |
|---|---|
| *G11C 16/04* | (2006.01) |
| *G11C 16/34* | (2006.01) |
| *G11C 11/56* | (2006.01) |
| *G11C 16/28* | (2006.01) |
| *G06F 3/06* | (2006.01) |

(52) U.S. Cl.
CPC ...... *G11C 16/3418* (2013.01); *G11C 11/5642* (2013.01); *G11C 16/28* (2013.01); *G11C 16/3495* (2013.01); *G06F 3/0619* (2013.01)

(58) Field of Classification Search
CPC .. G11C 16/3418; G11C 11/5642; G11C 16/28
USPC ..................................... 365/185.33
See application file for complete search history.

(56) References Cited

U.S. PATENT DOCUMENTS

| | | |
|---|---|---|
| 6,493,270 B2 | 12/2002 | Chevallier |
| 6,714,473 B1 | 3/2004 | Fiscus |
| 7,272,065 B2 | 9/2007 | Lovett |
| 7,457,183 B2 | 11/2008 | Lusky et al. |
| 7,551,486 B2 | 6/2009 | Cornwell et al. |
| 2010/0125760 A1* | 5/2010 | Nurminen ............. G06F 11/008 714/47.2 |
| 2016/0322113 A1* | 11/2016 | Parker ................ G11C 16/3418 |

\* cited by examiner

*Primary Examiner* — Huan Hoang
(74) *Attorney, Agent, or Firm* — Muncy, Geissler, Olds & Lowe, P.C.

(57) ABSTRACT

A flash memory device includes an array of non-volatile memory (NVM) cells, at least one detection NVM cell, and a sensing circuit. The array of NVM cells are configured to store data. The sensing circuit is coupled to the at least one detection NVM cell and is configured to measure a charge on the at least one detection NVM cell. The sensing circuit is also configured to compare the measured charge with a threshold charge level and to trigger a refresh of the array of NVM cells in response to the measured charge being less than the threshold charge level.

27 Claims, 11 Drawing Sheets

STRESS DETECTION IN A FLASH MEMORY DEVICE

FIELD OF DISCLOSURE

This disclosure relates generally to flash memory devices, and in particular, but not exclusively to electronic circuits for detecting stress of a flash memory device.

BACKGROUND

Non-volatile memory such as electrically programmable read-only memory (EPROM) and electrically-erasable programmable read-only memory (EEPROM) may be used for storing data in computer systems. EPROM and EEPROM comprise a large number of memory cells having electrically isolated gates, referred to as floating gates. Data is stored in the memory cells in the form of charge on the floating gates. Charge is transported to or removed from the floating gates by program and erase operations, respectively.

Another type of non-volatile memory is flash memory. Flash memory is a derivative of EPROM and EEPROM. Although flash memory shares many characteristics with EPROM and EEPROM, the current generation of flash memory differs in that erase operations are done in blocks.

A typical flash memory comprises a memory array which includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memories have the potential of replacing hard storage disk drives in computer systems. The advantages would be replacing a complex and delicate mechanical system with a rugged and easily portable small solid-state non-volatile memory system. There is also the possibility that given their very high potential densities and given their higher speed of operation, particularity in the erase operation, that flash memories might be used to replace DRAMs. Flash memories might then have the ability to fill all memory needs in current and/or future computer systems.

As mentioned above, flash memory devices utilize an array of cells that store information through the use of a charge on a floating gate. Under normal operating conditions, the flash memory device may be configured to periodically refresh the charge stored on the cells. In one example, the flash memory device may be configured to refresh the cells once per year. However, environmental stress, such as high temperatures, may cause the stored charge to leak out faster. That is, as a memory cell is exposed to high temperatures, the charge on the memory cell may leak out at an accelerated rate. If the charge leakage is high enough, the data in the memory array can be corrupted.

Thus, a system utilizing a flash memory device may desire to know if the flash memory device has experienced such stress in order to trigger a refresh of the cells in the flash memory device to prevent data loss. During a refresh, the contents of each memory cell may be read, corrected if necessary, and re-written to the memory cell so that the charge level is reset. Thus, when a flash memory device is utilized in an environment where high temperatures will be encountered, such as in automotive or IoT (internet of things) applications, it may be desirable to detect a stress event, such as when the device is exposed to a high temperature, in order to know when to refresh the flash memory.

SUMMARY

The following presents a simplified summary relating to one or more aspects and/or examples associated with the mechanisms disclosed herein for stress detection in a flash memory device. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary presents certain concepts relating to one or more aspects and/or examples relating to the mechanisms disclosed herein to detect stress in a flash memory device in a simplified form to precede the detailed description presented below.

According to one aspect, a flash memory device includes an array of non-volatile memory (NVM) cells, at least one detection NVM cell, and a sensing circuit. The array of NVM cells is configured to store data. The sensing circuit is coupled to the at least one detection NVM cell and is configured to measure a charge on the at least one detection NVM cell. The sensing circuit is also configured to compare the measured charge with a threshold charge level and to trigger a refresh of the array of NVM cells in response to the measured charge being less than the threshold charge level.

According to another aspect, a flash memory device includes an array of non-volatile memory (NVM) cells and at least one detection NVM cell. The array of NVM cells is configured to store data. The flash memory device also includes (i) means for measuring a charge on the at least one detection NVM cell; (ii) means for comparing the measured charge with a threshold charge level; and (iii) means for triggering a refresh of the array of NVM cells in response to the measured charge being less than the threshold charge level.

According to yet another aspect, a method is provided for use with a flash memory device. The flash memory device includes an array of non-volatile memory (NVM) cells configured to store data and at least one detection NVM cell. The method includes (i) measuring a charge on the at least one detection NVM cell; (ii) comparing the measured charge with a threshold charge level; and (iii) triggering a refresh of the array of NVM cells in response to the measured charge being less than the threshold charge level.

According to another aspect, a flash memory device includes a plurality of non-volatile memory (NVM) cells, a first detection NVM cell, a second detection NVM cell, and a sensing circuit. The plurality of NVM cells are arranged into at least a first block of NVM cells and a second block of NVM cells, where the plurality of NVM cells are configured to store data. The first detection NVM cell is disposed proximate to the first block of NVM cells and the second detection NVM cell is disposed proximate to the second block of NVM cells. The sensing circuit is coupled to the first detection NVM cell and to the second detection NVM cell. The sensing circuit is configured to (i) measure a first charge on the first detection NVM cell; (ii) measure a second charge on the second detection NVM cell; (iii) compare the first charge with a first threshold charge level associated with the first block of NVM cells; (iv) compare the second charge with a second threshold charge level associated with the second block of NVM cells; (v) trigger a refresh of the first block of NVM cells in response to the first charge being less than the first threshold charge level; and (vi) trigger a refresh of the second block of NVM cells in response to the second charge being less than the second threshold charge level.

BRIEF DESCRIPTION OF THE DRAWINGS

The accompanying drawings are presented to aid in the description of examples of the invention and are provided solely for illustration of the examples and not limitation thereof.

DETAILED DESCRIPTION

Aspects of the invention are disclosed in the following description and related drawings directed to specific examples of the invention. Alternate examples may be devised without departing from the scope of the invention. Additionally, well-known elements of the invention will not be described in detail or will be omitted so as not to obscure the relevant details of the invention.

The terminology used herein is for the purpose of describing particular examples only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, some aspects may be described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the present disclosure may be embodied in a number of different forms, all of which have been contemplated to be within the scope of the claimed subject matter.

Figure 1:
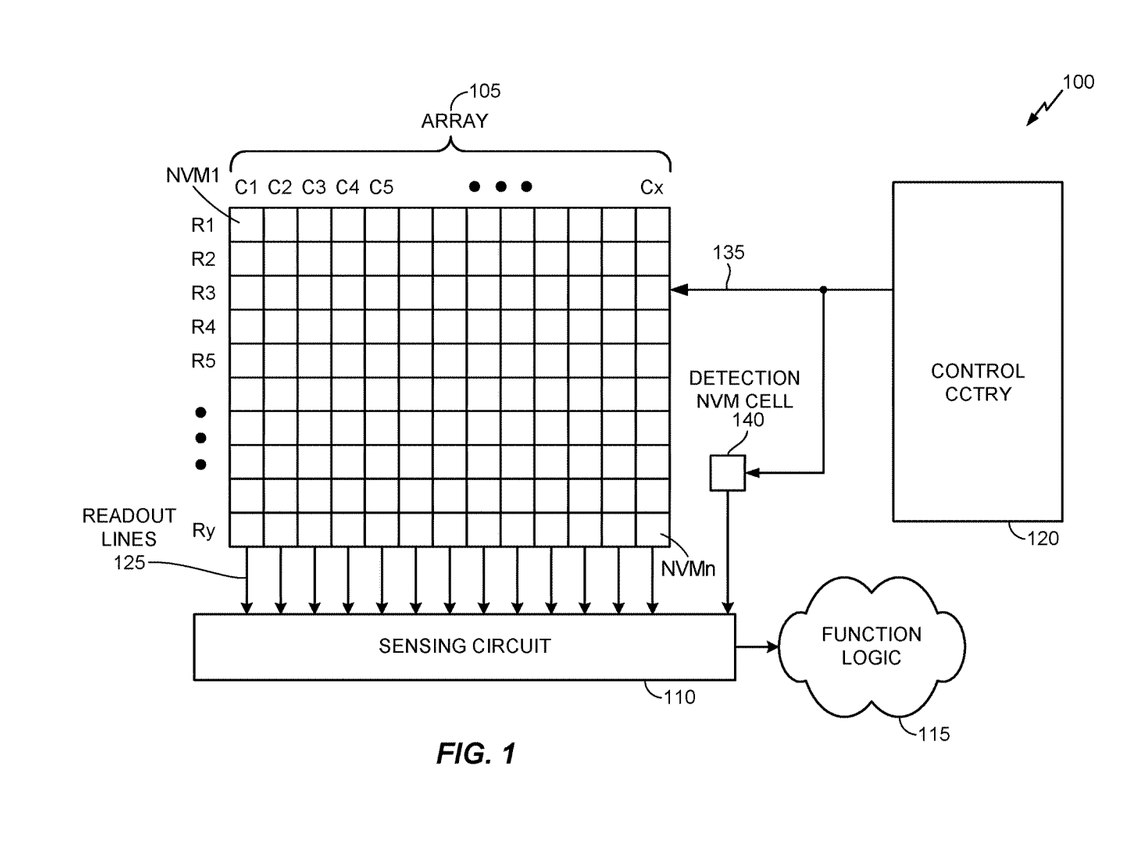
FIG. 1 is a block diagram illustrating an example flash memory device, in accordance with an aspect of the present disclosure.

FIG. 1 is a block diagram illustrating an example flash memory device 100, in accordance with an aspect of the present disclosure. The illustrated example of flash memory device 100 includes an array 105, sensing circuit 110, function logic 115, control circuitry 120, and at least one detection non-volatile memory (NVM) cell 140. Also illustrated in FIG. 1 are control signals 135 and readout lines 125.

In one example, array 105 is a two-dimensional array of NVM cells (e.g., NVM cells NVM1, . . . , NVMn). Each NVM cell included in the array 105 may be a metal-oxide-semiconductor ("MOS") non-volatile memory cell configured to store data. As illustrated, each NVM cell is arranged into a row (e.g., rows R1 to Ry) and a column (e.g., column C1 to Cx).

Control circuitry 120 is coupled to array 105 to control operational characteristics of array 105 and/or the detection NVM cell 140 via one or more control signals 135. For example, control circuitry 120 may generate a row select, column select, and/or a reset signal for controlling the read, erasure, and/or refreshing of the charge values stored at each NVM cell and/or the detection NVM cell 140.

During a read operation, during normal memory operations, the charge values of the NVM cells of array 105 are readout by sensing circuit 110 via readout lines 125 which are then transferred to function logic 115. In one example, the detection NVM cell 140 is a dedicated memory cell for detecting a stress event on the flash memory device 100, where the detection NVM cell 140 is not utilized for the storage of data during normal memory operations. Instead, during a stress detection operation, the charge value of the detection NVM cell 140 is readout by sensing circuit 110 via one or more readout lines 125 to determine whether such a stress event has indeed occurred. Sensing circuit 110 may include amplification circuitry, sense amplifiers, error correction circuitry, analog-to-digital conversion circuitry, threshold charge level detection circuitry, or otherwise. Function logic 115 may simply storage the data. In one example, sensing circuit 110 may readout a row of data values at a time along readout lines 125 or may readout the data values using a variety of other techniques (not illustrated), such as a serial readout or a full parallel readout of the target NVM cells simultaneously.

As mentioned above, each NVM cell included in the array 105 may store information through the use of a charge on a floating gate. However, environmental stress, such as high temperatures, may cause the stored charge to leak out faster. That is, as the NVM cells are exposed to high temperatures, the charge on the NVM cells may leak out at an accelerated rate. If the charge leakage is high enough, the data in the array 105 can be corrupted. Accordingly, aspects of the present disclosure provide for a flash memory device 100 that includes one or more detection NVM cells 140 placed in or around the array 105 for the purpose of detecting accelerated charge loss that may be due to a stress event, such as exposure to high temperatures.

Figure 2:
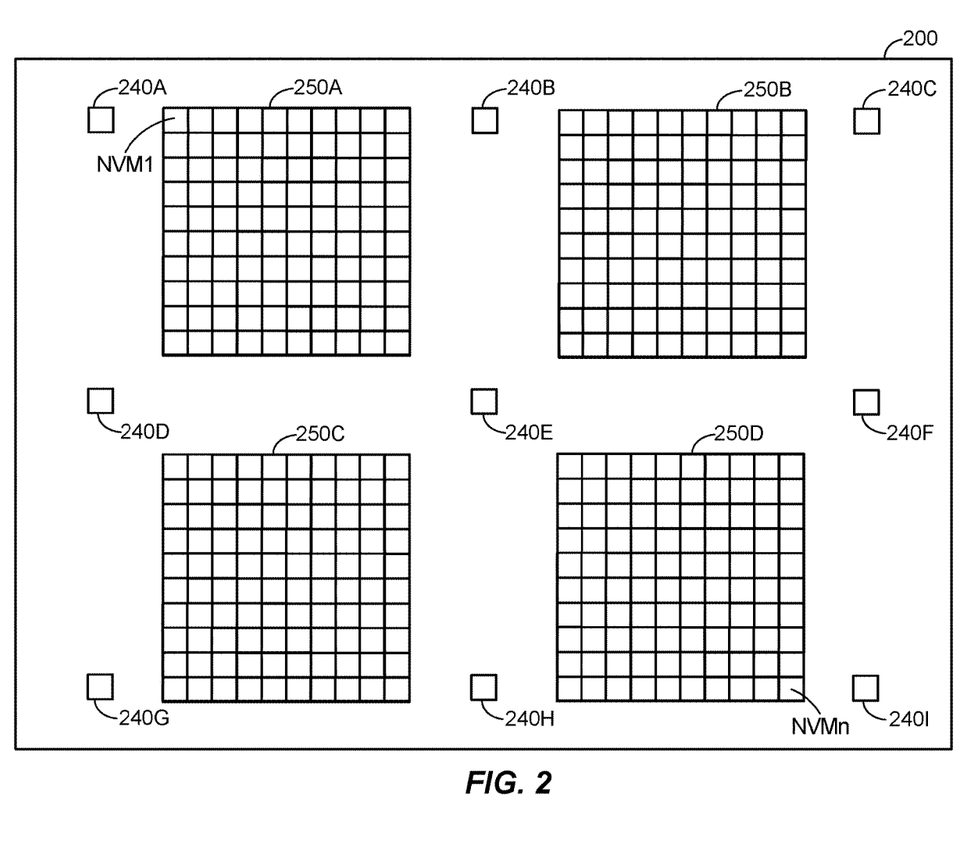
FIG. 2 is a block diagram illustrating an example plurality of non-volatile memory (NVM) cells arranged into blocks, in accordance with an aspect of the present disclosure.

In one aspect, the detection NVM cell 140 is disposed proximate to the array 105 such that a stress event to the NVM cells included in the array 105 causes leakage in both the detection NVM cell 140 and in the NVM cells included in the array 105. For example, FIG. 2 is a block diagram illustrating an example plurality of non-volatile memory (NVM) cells arranged into blocks 250A-D, in accordance with an aspect of the present disclosure. The blocks of NVM cells 250A-D are one possible arrangement of the array 105 of NVM cells illustrated in FIG. 1. Also shown in FIG. 2 are a plurality of detection NVM cells 240A-240I disposed proximate and near the blocks 250A-D. In one aspect, both the blocks of NVM cells 250A-D and the detection NVM cells 240A-I are disposed on a single substrate 200. As discussed above, the detection NVM cells are disposed such that a stress event to a block of NVM cells causes charge leakage in both the block of NVM cells and a corresponding detection NVM cell. For example, a stress event, such as one caused by high temperatures, experienced by the block of NVM cells 250A may cause charge leakage in both the NVM cells of the block 250A and in one or more detection NVM cells, such as detection NVM cells 240A, 240B, 240D, and/or 240E. In one aspect, the substrate 200 includes a plurality of detection NVM cells spaced apart in disparate locations across substrate 200. The inclusion of several detection NVM cells spaced apart on substrate 200 may, in one aspect, allow for localized stress detection. For example, measurements of detection NVM cell 240G may allow for the detection of a stress event on or around block of NVM cells 250C. Similarly, measurements of detection NVM cell 240I may allow for the detection of a stress event on or around block of NVM cells 250D.

In some aspects, the flash memory device (e.g., flash memory device 100 of FIG. 1) is configured such that there is no specific correlation between any one detection NVM cells and a block of NVM cells. For example, referring to FIG. 2, although substrate 200 includes several detection NVM cells 240A-I disposed across substrate 200, in one aspect, the detection of a stress event by any of the illustrated detection NVM cells 240A-I may trigger a refresh of the entire flash memory device (i.e., refresh of all blocks of NVM cells 250A-D may be triggered by measurement of any of the detection NVM cells 240A-I). By way of example, flash memory device 100 may be configured to perform a measurement of detection NVM cell 240E, determine whether that measurement indicates a stress event has occurred, and if so, trigger a refresh of all the blocks of NVM cells 250A-D.

In some aspects, the detection NVM cells (e.g., detection NVM cell 140 and/or detection NVM cells 240A-I) are similar in structure and/or configuration to each of the NVM cells included in the array 105. For example, FIG. 3A is a diagram illustrating a cross-sectional view of a floating-gate structure 300 of an example implementation of each NVM cell of array 105 and detection NVM cell 140 of FIG. 1, and/or an example implementation of each NVM cell of blocks 250A-D and the detection NVM cells 240A-I of FIG. 2.

Figure 3A:
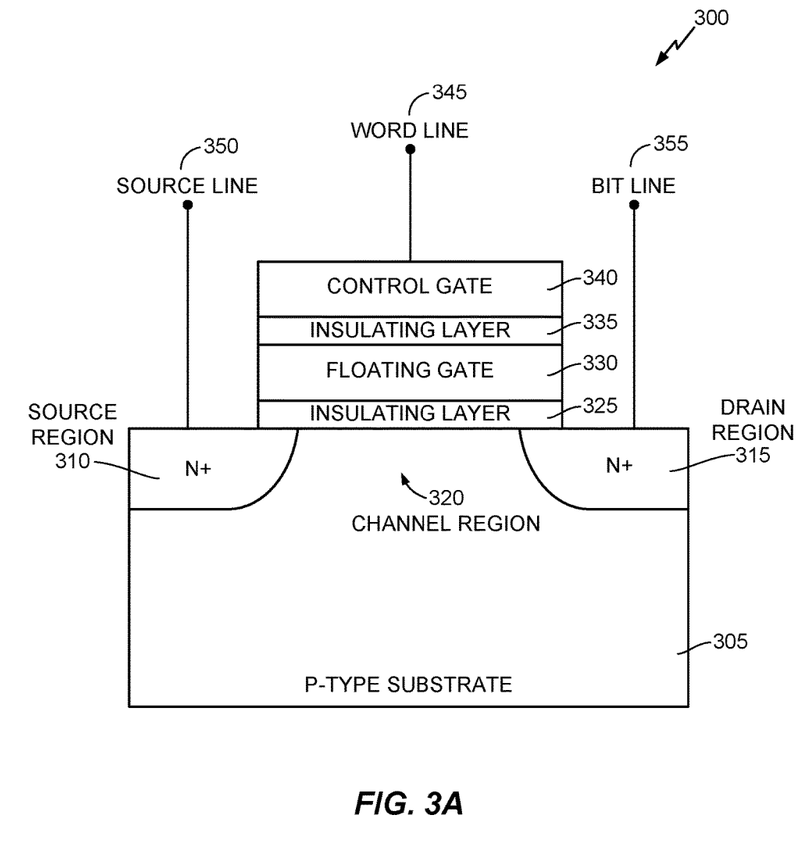
FIG. 3A is a diagram illustrating a floating-gate structure of an example implementation of NVM cells and detection NVM cells of FIGS. 1 and 2.

As shown in FIG. 3A, the floating-gate structure 300 includes a source region 310 and a drain region 315. Source region 310 and drain region 315 may be formed from an N+ type of high impurity concentration which are formed in a P-type semiconductor substrate 305 of low impurity concentration. Source region 310 and drain region 315 may be separated by a predetermined space of a channel region 320. The floating-gate structure 300 further includes a floating gate 330 and a control gate 340. In one aspect, the floating-gate 330 is a first polysilicon (poly) layer, and the control gate 340 is a second poly layer. Floating gate 330 is isolated from the channel region 320 by a first insulating layer 325 and from control gate 340 by a second insulating layer 335. In one aspect, the second insulating layer 335 is an inter poly dielectric layer and the first insulating layer 325 is a thin oxide layer approximately 100 angstroms (Å) thick.

As further shown in FIG. 3A, floating-gate structure 300 includes a word line 345, a source line 350, and a bit line 355. In one aspect, the word line 345 is electrically coupled to the control gate 340, the source line 350 is electrically coupled to the source region 310, and the bit line 355 is electrically coupled to the drain region 315 by way of one or more metal interconnect layers (i.e., routings) included in the array (e.g., array 105). In one aspect, the word line 345, the source line 350, and the bit line 355 are configured to provide one or more control signals, such as control signals 135 of FIG. 1 to the floating-gate structure 300 to control programming, erasure, and/or refresh of the NVM cells in the array and/or detection NVM cell 140.

Figure 3B:
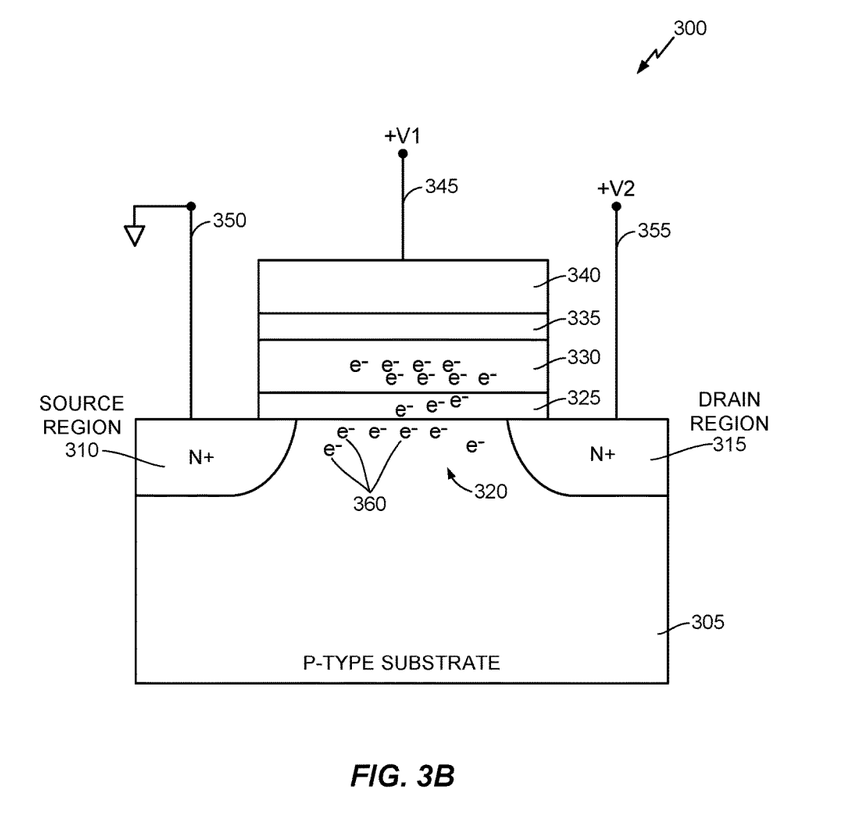
FIG. 3B is a diagram illustrating the programming of the floating-gate structure of FIG. 3A.

For example, FIG. 3B is a diagram illustrating the programming of the floating-gate structure 300 of FIG. 3A. During a programming operation, a positive programming voltage +V1 (e.g., about 12 volts) is applied to control gate 340. This positive programming voltage V1 attracts charge carriers 360 from P-type substrate 305 and causes them to accumulate at the surface of channel region 320. A voltage on drain region may then be increased to a positive voltage V2 (e.g., about 6 volts). Furthermore, the source region 310 is electrically coupled to common reference (e.g., ground). As the drain-to-source voltage increases, the charge carriers 360 flow from source region 310 to the drain region 315 via channel region 320. As charge carriers 360 travel toward drain region 315, they may acquire a substantially large amount kinetic energy, which in some aspects may be referred to as "hot electrons".

The voltages V1 and V2 at control gate 340 and drain region 315 creates an electric field in the first insulating layer 325. This electric field attracts the hot electrons and accelerates them toward the floating gate 330. At this point, floating gate 330 begins to trap and accumulate the hot electrons and starts a charging process. Gradually, as the charge on the floating gate 330 increases, the electric field in the first insulating layer 325 decreases and eventually loses it capability of attracting any more of the hot electrons to floating gate 330. At this point, floating gate 330 may be considered fully charged. In one aspect, the negative charge from the hot electrons collected in the floating gate 330 raises the threshold voltage (Vt) of the floating-gate structure 300 to above a logic "1" voltage.

During a read operation, a voltage on control gate 340 is brought to a logic "1" where the programmed floating-gate structure 300 will barely turn on. A sensing circuit, such as sensing circuit 110 may then be used to detect and amplify the state of floating-gate structure 300 during a read operation. Thus, data may be read from floating-gate structure 300 based upon its "on" characteristics.

An erase operation of the floating-gate structure 300 may include removing electrons from the floating gate 330. By way of example, floating-gate structure 300 may be erased utilizing Fowler-Nordheim (FN) tunneling to perform an erase operation. That is, the erase procedure may be accomplished by electrically floating the drain region 315, grounding the source region 310, and applying a high negative voltage (−12 volts) to the control gate 340. This creates an electric field across the insulating layer 325 and forces electrons off of the floating gate 330 which then tunnel through the insulating layer 325.

Figure 3C:
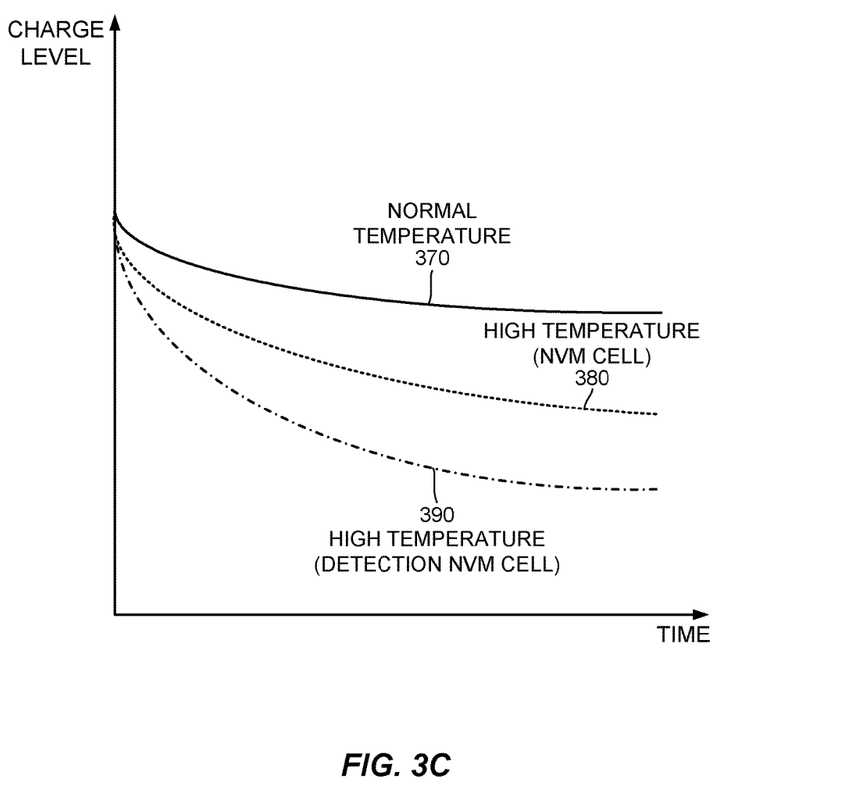
FIG. 3C is a diagram illustrating the effect of temperature on charge leakage experienced by the floating-gate structure of FIG. 3A.

As mentioned above, environmental stress, such as high temperatures, may cause charge stored on a floating gate (e.g., floating gate 330 of FIG. 3B) to leak out faster. By way of illustration, FIG. 3C is a diagram that shows the effect of temperature on charge leakage experienced by the floating-gate structure 300 of FIGS. 3A and 3B. That is, curve 370 illustrates an example charge leakage of an NVM cell (e.g., NVM cells of array 105) when under a normal operating temperature. Curve 380 illustrates an example charge leakage of the same NVM cell when the NVM cell is exposed to a high temperature. As can be seen from FIG. 3C, the charge leakage of an NVM cell is greater at higher temperatures as when compared to normal (i.e., lower) temperatures. In other words, the charge level of an NVM cell will decrease more at higher temperatures as compared to the decrease in charge level of an NVM cell at lower temperatures for the same amount of time.

Despite the detection NVM cells 140 and each of the NVM cells of the array 105 having the same or similar floating-gate structure 300, some aspects of the present disclosure may include the configuration of the detection NVM cells 140 to include one or more properties that have been changed to increase the charge leakage in these detection NVM cells 140 as compared to the charge leakage experienced by the NVM cells in the array 105. For example, FIG. 3C further illustrates a curve 390 which shows an example charge leakage of a detection NVM cell, such as detection NVM cell 140. As can be seen from curve 390, the charge leakage of detection NVM cell 140 is greater as when compared to an NVM cell of array 105 for the same temperature. In other words, the charge level of a detection NVM cell will decrease more as compared to the decrease in charge level of an NVM cell for the same temperature over the same period of time.

By increasing the rate of charge leakage in the detection NVM cells, a stress event (e.g., high temperature) can be detected prior to data corruption occurring in the NVM cells of array 105. Even further, the charge leakage of these detection NVM cells due to a stress event occurs even if the flash memory device is powered off. That is, the detection NVM cells may experience accelerated charge leakage due to high temperatures even when powered off. Thus, when powered back on, a sensing circuit, such as sensing circuit 110 may measure the charge on the detection NVM cells and compare the measured charge with a threshold charge level. If the measured charge is less than the threshold charge level a stress event was experienced and thus a refresh of the array 105 may be triggered.

Figure 4:
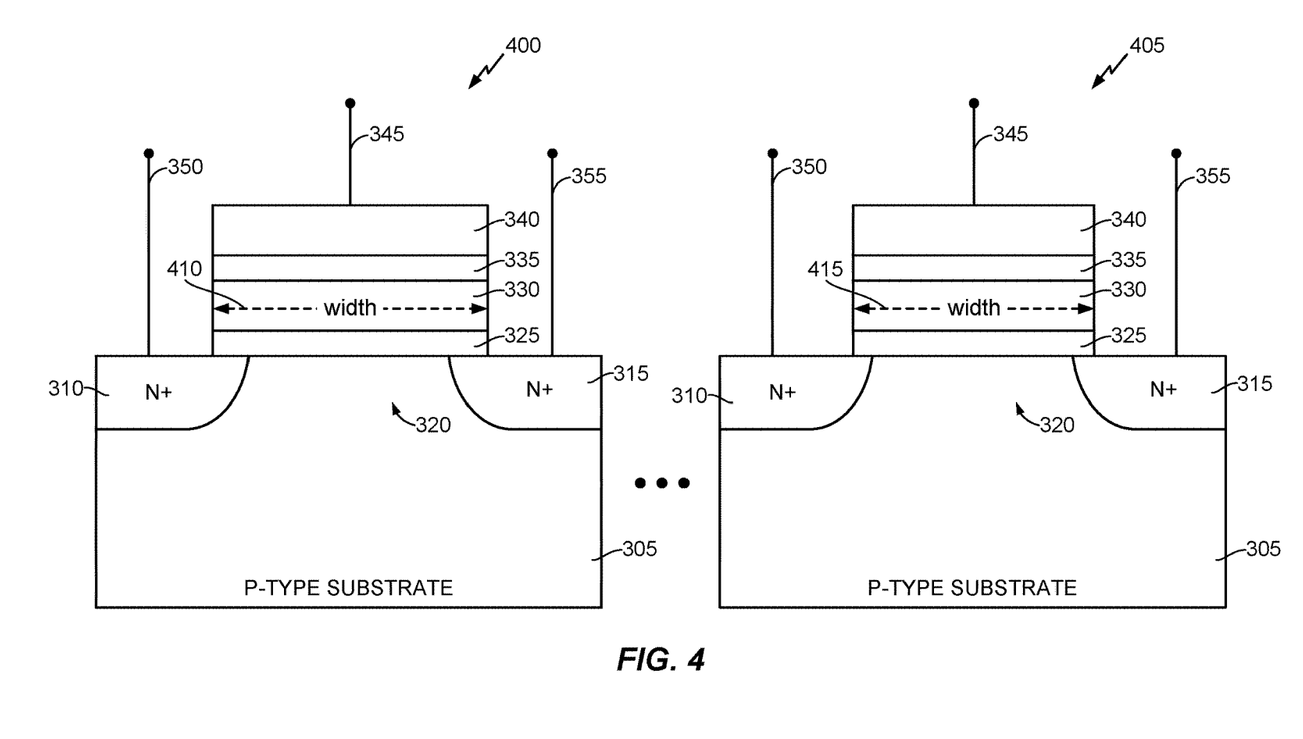
FIG. 4 is diagram illustrating an example an NVM cell and a detection NVM cell where a floating gate of the NVM cell has a different size than a floating gate of the detection NVM cell, in accordance with an aspect of the present disclosure.

One property of a detection NVM cell that may be changed to increase charge leakage includes the size of the floating gate. That is, the size of the floating gate 330 of the detection NVM cell 140 may be different than the size of the floating gates 330 included in each NVM cell of array 105. By way of example, FIG. 4 is diagram illustrating an example an NVM cell 400 and a detection NVM cell 405 where a floating gate 330 of the NVM cell 400 has a different size than a floating gate 330 of the detection NVM cell 405. NVM cell 400 may correspond to each NVM cell included in array 105 of FIG. 1 and/or each NVM cell included in blocks 250A-D of FIG. 2. Detection NVM cell 405 may correspond to detection NVM cell 140 of FIG. 1 and/or any of the detection NVM cells 240A-I of FIG. 2. In one example, a different size floating gate may refer to a different width of the floating gate. That is, FIG. 4 illustrates NVM cell 400 having a first floating gate width 410 and detection NVM cell 405 having a second floating gate width 415 (first floating gate width 410≠second floating gate width 415). Depending on the configuration of the detection NVM cell a larger floating gate width may increase charge leakage, whereas in other configurations a smaller floating gate width may increase charge leakage. Although the above example provides for the NVM cell 400 to have a different floating gate width than the detection NVM cell 405, in other examples any parameter that affects the total gate area may be changed in accordance with aspects of the present disclosure. For example, the length of floating gate 330 of detection NVM cell 405 may be changed, or both the length and width of floating gate 330 of detection NVM cell 405 may be changed, to increase the charge leakage of detection NVM cell 405.

Figure 5:
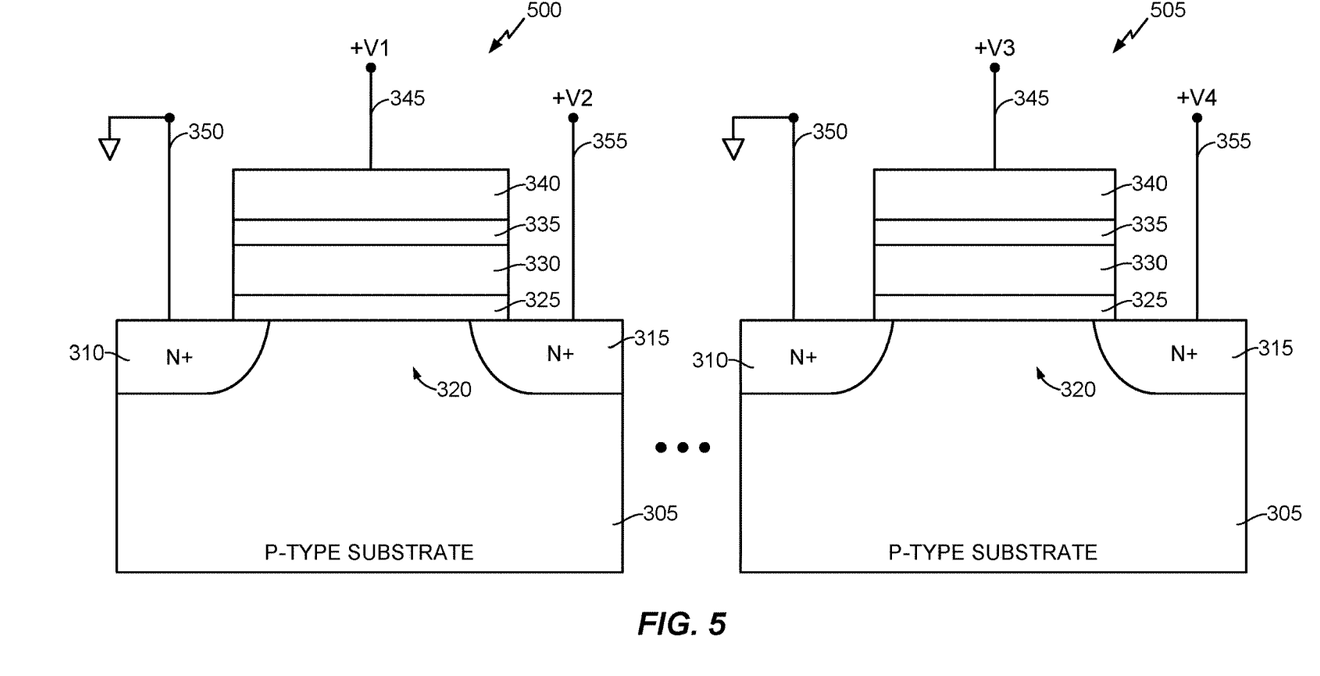
FIG. 5 is diagram illustrating an example an NVM cell and a detection NVM cell where the detection NVM cell is programmed to a charge level different from the charge level used to program the NVM cell, in accordance with an aspect of the present disclosure.

Another example property of the detection NVM cell that may be changed to increase charge leakage is the programming charge level. That is, in one aspect, the detection NVM cell may be programmed to a charge level different than a charge level utilized for programming the memory cells of the array. FIG. 5 is diagram illustrating an example NVM cell 500 and detection NVM cell 505 where the detection NVM cell 505 is programmed to a charge level different from the charge level used to program the NVM cell 500. NVM cell 500 may correspond to each NVM cell included in array 105 of FIG. 1 and/or each NVM cell included in blocks 250A-D of FIG. 2. Detection NVM cell 505 may correspond to detection NVM cell 140 of FIG. 1 and/or any of the detection NVM cells 240A-I of FIG. 2. In one example, a different charge level of the NVM cell 500 and the detection NVM cell 505 may be dependent on the voltages applied to the control gate 340 and/or drain region 315. That is, FIG. 5 illustrates NVM cell 500 being programmed using a voltage V1 applied to the control gate 340 of NVM cell 500 and a voltage V2 applied to the drain region 315 of NVM cell 500, whereas detection NVM cell 505 is programmed using a voltage V3 applied to the control gate 340 of detection NVM cell 505 and a voltage V4 applied to the drain region 315 of detection NVM cell 505. In some examples, V14≠V3 and/or V2≠V4. Thus, the detection NVM cell 505 may be charged to a higher charge level, a lower charge level, or at some mid-point between multiple charge levels utilized by NVM cell 500. That is, in some examples, NVM cell 500 may utilize multi-level programming, where multiple bits of data may be stored in a single floating-gate structure. In this example, the detection NVM cell 505 may be programmed to a mid-point charge level, different from the charge levels utilized by the NVM cell 500, where a deviation from the initial programmed charge level in the detection NVM cell 505 can be detected by the sensing circuit 110.

In one aspect, the floating gate 330 of detection NVM cell 505 has the same size (e.g., width) as the NVM cell 500, where the programming charge level, alone, is adjusted to increase the charge leakage of the detection NVM cell 505. In other examples, both the floating gate width (i.e., such as discussed above with reference to FIG. 4) and the programming charge level may be adjusted to increase the charge leakage of the detection NVM cell 505.

Figure 6:
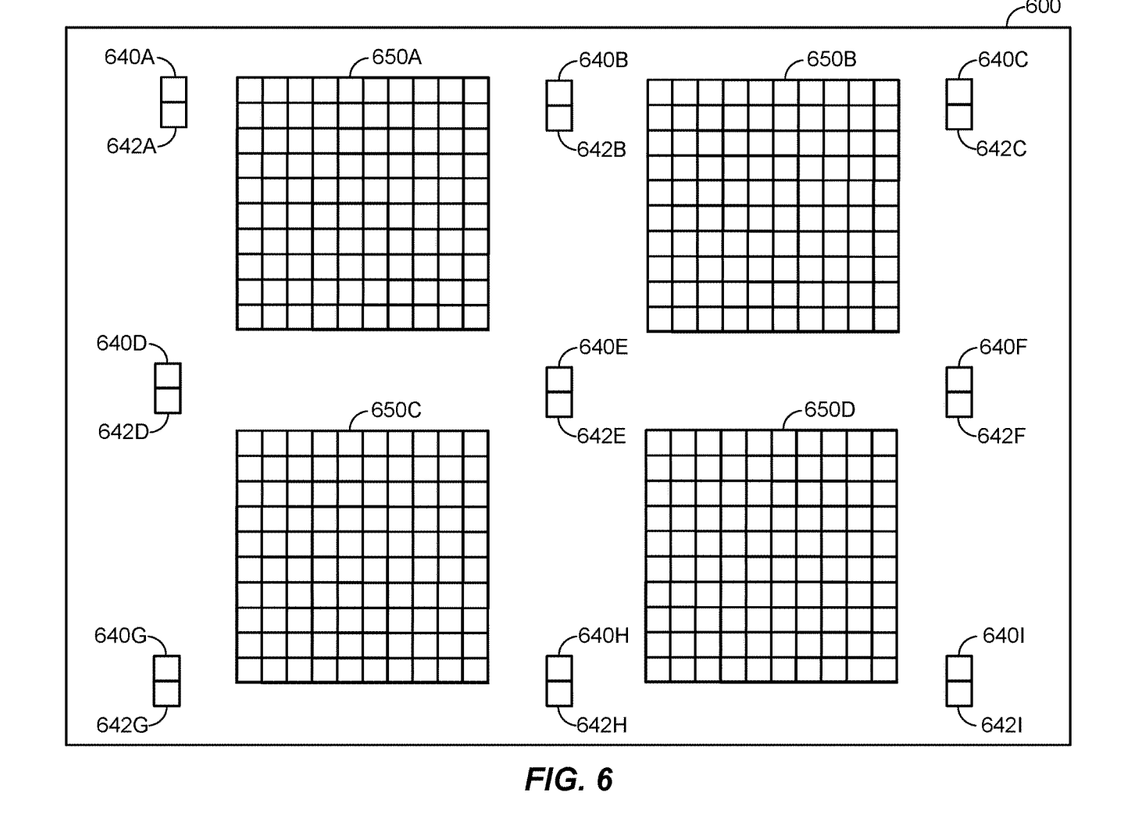
FIG. 6 is a block diagram illustrating a plurality of detection NVM cell that each includes a corresponding fully-charged memory cell disposed immediately adjacent to the detection NVM cell to increase charge migration out of the detection NVM cell, in accordance with an aspect of the present disclosure.

In another example, the charge leakage of the detection NVM cell may be increased by placing another memory cell immediately adjacent to the detection NVM cell. For example, FIG. 6 is a block diagram illustrating a plurality of detection NVM cells 640A-I that each include a corresponding fully-charged memory cell 642A-I disposed immediately adjacent to the detection NVM cell 640A-I to increase charge migration out of the detection NVM cells 640A-I. In one example, memory cells 642A-I are of the same floating-gate structure 300 as the detection NVM cells and are not utilized for the storage of data. Thus, memory cells 642A-I may be considered sacrificial memory cells with the dedicated purpose of increasing the charge leakage of the corresponding detection NVM cells 640A-I. In operation, charge carriers (e.g., charge carriers 360 of FIG. 3B) migrate around a detection NVM cell and occasionally may migrate from one floating-gate to another floating-gate through tunneling. In some aspects, the rate of tunneling between adjacent cells is affected by temperature. Thus, a memory cell placed immediately adjacent to a detection NVM cell means that there will be occasions where an electron can jump from the floating gate of a detection NVM cell to the memory cell immediately adjacent to the detection NVM cell (e.g., electrons can migrate, through tunneling, from the floating gate of detection NVM cell 640A to the floating gate of immediately-adjacent memory cell 642A). In some aspects, an insulator may be disposed between a detection NVM cell (e.g., detection NVM cell 640A) and an immediately adjacent memory cell (e.g., memory cell 642A), where a thickness of the insulator is adjusted to control the amount of tunneling between the detection NVM cell and corresponding memory cell (i.e., to increase the charge leakage of the detection NVM cell).

In one aspect, the charge leakage of the detection NVM cells 640A-I may be increased solely by the inclusion of fully-charged memory cells 642A-I. However, in other examples, the fully-charge memory cells 642A-I may be combined with any of the aforementioned techniques of increasing the charge leakage including adjusting the floating gate size and/or adjusting the programming charge level of the detection NVM cells 640A-I.

Figure 7:
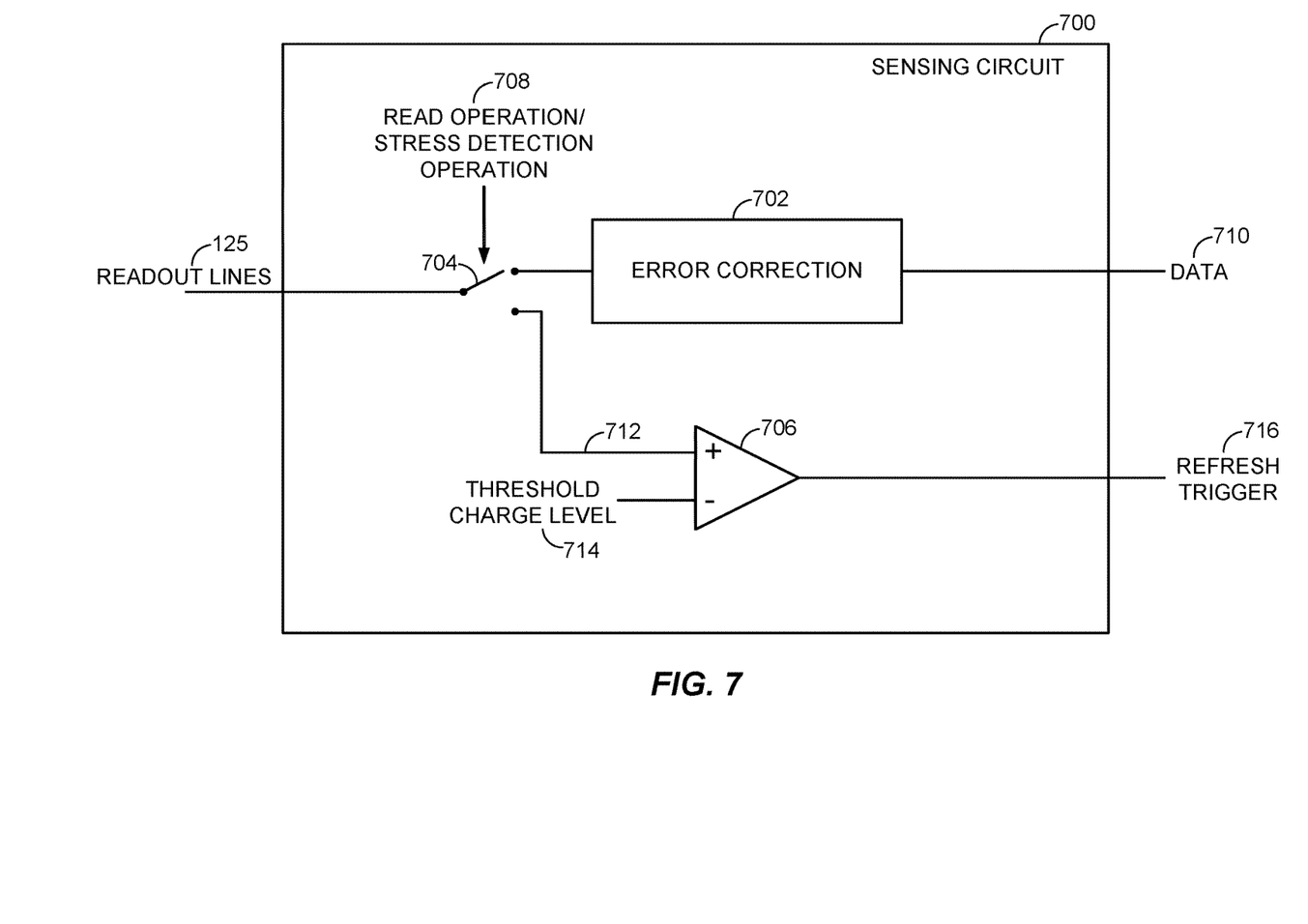
FIG. 7 is a diagram illustrating an example implementation of a sensing circuit, in accordance with an aspect of the present disclosure.

FIG. 7 is a diagram illustrating an example implementation of a sensing circuit 700, in accordance with an aspect of the present disclosure. Sensing circuit 700 is one possible implementation of sensing circuit 110 of FIG. 1. The illustrated example of sensing circuit 700 is shown as including an error correction circuit 702, a switch 704, and a comparator 706. Further shown in FIG. 7 are a read/stress detection operation signal 708, a data signal 710, a measured charge signal 712, a threshold charge level signal 714, and a refresh trigger signal 716.

During normal memory operations, a read operation may be performed to read out data stored in one or more of the NVM cells included in array 105 (see FIG. 1). In some implementations, reading information stored on the array 105 of NVM cells may include some form of error correction by way of error correction circuit 702 for compensating for ambiguous charge levels. Thus, during the read operation, the switch 704 may couple the readout lines 125 to the error correction circuit 702, which then provides the error corrected values via a data signal 710. However, when measuring the charge level from the detection NVM cells during a stress detection operation, error correction may not be desired, and instead the raw analog signal may just be desired in order to correctly ascertain the actual charge level currently stored on the detection NVM cells. Thus, during a stress detection operation, switch 704 may couple the readout lines 125 to comparator 706, where comparator 706 then compares the measured charge 712 directly with a threshold charge level 714. If the measured charge 712 is less than the threshold charge level 714, then comparator 706 may generate a refresh trigger signal 716 to trigger the refresh of the NVM cells included array 105 and/or only the block of NVM cells corresponding to the measured detection NVM cell.

As discussed above, in some examples, the NVM cell may utilize multi-level programming, where multiple bits of data may be stored in a single floating-gate structure. Thus, in this example, the threshold charge level 714 may represent multiple threshold charge levels, one for each bit level. That is, in flash memory devices that have multiple bits stored per NVM cell, multiple threshold charge levels 714 may utilized to identify excessive charge leakage associated with each bit level.

As mentioned above, aspects of the present disclosure include one or more detection NVM cells that may be utilized to have an accelerated charge leakage even when the flash memory device (e.g., flash memory device 100 of FIG. 1) is powered off. Thus, in some examples, the flash memory device 100 may be configured to perform a stress detection operation in response to the flash memory device 100 changing from a powered off state to a powered on state. In addition thereto, the flash memory device 100 may be configured to perform the stress detection operation periodically while the flash memory device 100 is powered on. In one aspect, the stress detection operation is performed under control of a host controller. That is, in one example, the flash memory device (e.g., flash memory device 100) may be configured to receive a command from a host controller to initiate the stress detection operation. In response to receiving the command from a host controller, the flash memory device may initiate the stress detection operation that includes one or more measurements of the detection NVM cells and performing the refresh operation if necessary.

Furthermore, the above examples provide for one or more detection NVM cells that are configured to have charge leakage greater than the charge leakage of any of the NVM cells included in the array 105. However, in other examples, the detection NVM cells may have the same charge leakage as the NVM cells of array 105, but instead where the threshold charge level 714 is lowered. That is, in one example, it may be determined that NVM cells included in the array 105 will likely suffer data corruption when their programmed charge level drops below a certain value. Thus, the threshold charge level 714 may be decreased to less than that value (i.e., lower than the charge value at which data corruption is expected) to allow the detection of a stress event before the data corruption in fact occurs.

Figure 8:
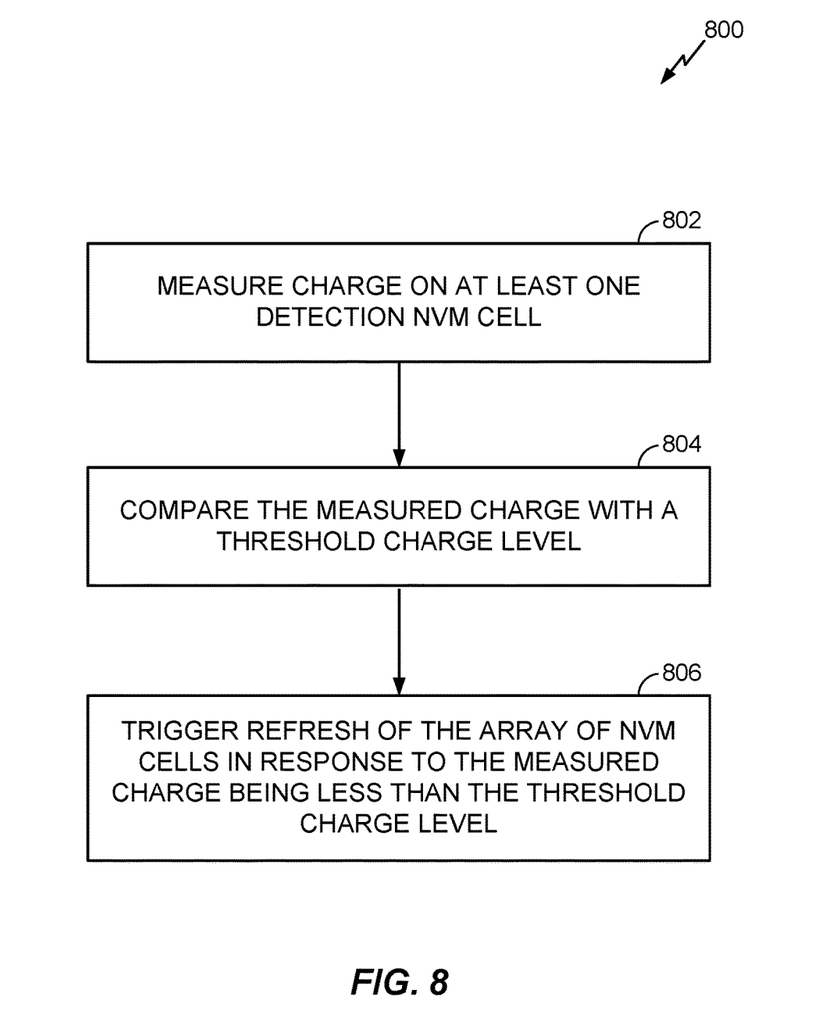
FIG. 8 is a flow chart illustrating a process of detecting stress in a flash memory device, in accordance with an aspect of the present disclosure.

FIG. 8 is a flow chart illustrating a process 800 of detecting stress in a flash memory device, in accordance with an aspect of the present disclosure. Process 800 is one possible process performed by flash memory device 100 of FIG. 1 for performing a stress detection operation. As mentioned above, process 800 may be performed by the flash memory device 100 in response to the flash memory device 100 changing from a power off state to a powered on state, or may be performed periodically while the flash memory device 100 is powered on. In a process block 802, a sensing circuit (e.g., sensing circuit 110 of FIG. 1 and/or sensing circuit 700 of FIG. 7) measures a charge on at least one detection NVM cell (e.g., detection NVM cell 140 of FIG. 1). In a process block 804, the sensing circuit compares the measured charge with a threshold charge level (e.g., comparator 706 of FIG. 7 compares the measured charge 712 with the threshold charge level 714). Next, in a process block 806, the sensing circuit triggers a refresh of the array 105 of NVM cells in response to the measured charge being less than the threshold charge level (e.g., comparator 706 generates the refresh trigger signal 716). In one aspect, triggering a refresh may include initiating a refresh operation of the NVM cells of the array 105 that includes the contents of each NVM cell being read, corrected if necessary, and re-written to the NVM cell so that the charge level is reset.

Figure 9:
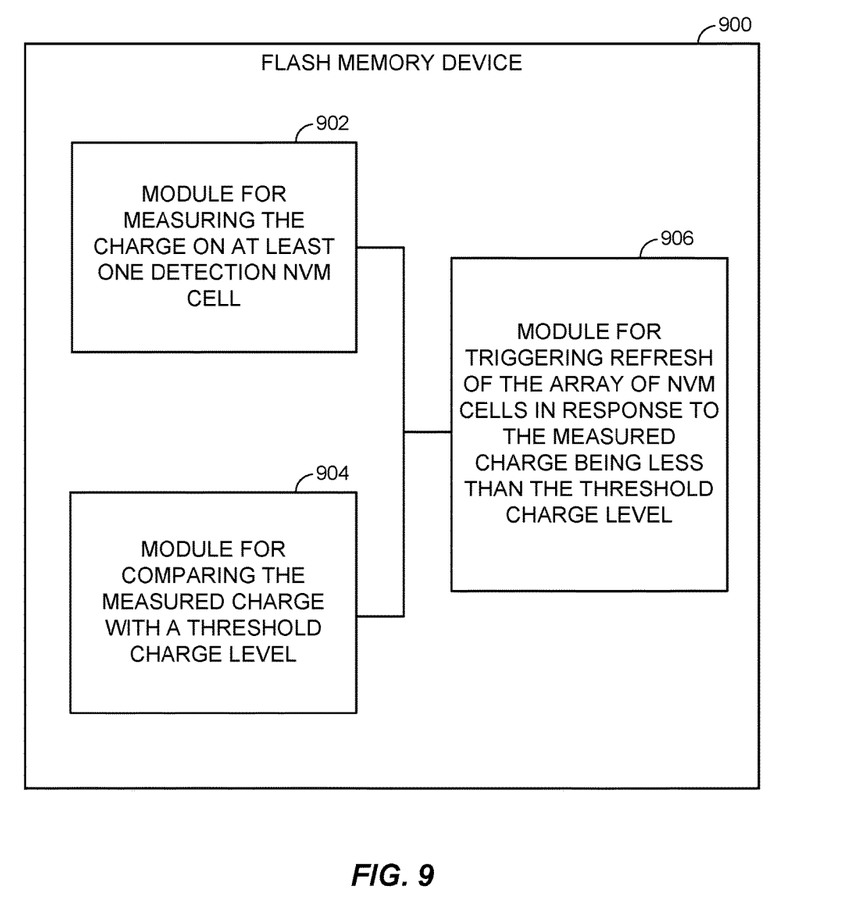
FIG. 9 is a diagram illustrating several sample aspects of components that may be employed in flash memory device, in accordance with an aspect of the present disclosure.

FIG. 9 is a diagram illustrating several sample aspects of components that may be employed in flash memory device, in accordance with an aspect of the present disclosure. A module 902 for measuring the charge on at least one detection NVM cell may correspond at least in some aspects to, for example, the sensing circuit 110 of FIG. 1 and/or the sensing circuit 700 of FIG. 7. A module 904 for comparing the measured charge with a threshold charge level may correspond at least in some aspects to, for example, the sensing circuit 110 of FIG. 1 and/or the comparator 706 of FIG. 7. A module 906 for triggering a refresh of the array of NVM cells in response to the measured charge being less than the threshold charge level may correspond at least in some aspects to, for example, the sensing circuit 110 of FIG. 1 and/or the comparator 706 of FIG. 7.

The functionality of the modules of FIG. 9 may be implemented in various ways consistent with the teachings herein. In some designs, the functionality of these modules may be implemented as one or more electrical components. In some designs, the functionality of these blocks may be implemented as a processing system including one or more processor components. In some designs, the functionality of these modules may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the components and functions represented by FIG. 9, as well as other components and functions described herein, may be implemented using any suitable means. Such means also may be implemented, at least in part, using corresponding structure as taught herein. For example, the components described above in conjunction with the "module for" components of FIG. 9 also may correspond to similarly designated "means for" functionality. Thus, in some aspects one or more of such means may be implemented using one or more of processor components, integrated circuits, or other suitable structure as taught herein.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the present disclosure can include a non-transitory computer readable media embodying a method for performing a stress detection operation, such as that described above with reference to process 600 of FIG. 6. Accordingly, the invention is not limited to illustrated examples and any means for performing the functionality described herein are included in examples of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A flash memory device, comprising:
an array of non-volatile memory (NVM) cells configured to store data;
at least one detection NVM cell; and
a sensing circuit coupled to the at least one detection NVM cell wherein the sensing circuit is coupled to the array of NVM cells to read out the data of the array of NVM cells during a read operation and coupled to the at least one detection NVM cell to measure the charge on the at least one detection NVM cell during a stress detection operation, and wherein the sensing circuit is configured to:
measure a charge on the at least one detection NVM cell;
compare the charge with a threshold charge level; and
trigger a refresh of the array of NVM cells in response to the measured charge being less than the threshold charge level.

2. The flash memory device of claim 1, wherein each NVM cell of the array of NVM cells is charged to multiple charge levels for storing data and wherein the at least one detection NVM cell is programmed to a charge level other than any of the multiple charge levels used by the NVM cells to store data.

3. The flash memory device of claim 1, wherein each NVM cell of the array of NVM cells includes a floating gate having a first size and wherein the at least one detection NVM cell includes a floating gate having a second size that is different than the first size configured to have a charge leakage in the at least one detection NVM detection cell greater than a charge leakage of NVM cells included in the array of NVM cells.

4. The flash memory device of claim 1, further comprising at least one fully charged memory cell immediately adjacent to the at least one detection NVM cell to increase charge migration out of the at least one detection NVM cell.

5. The flash memory device of claim 1, wherein the at least one detection NVM cell is configured to have a charge leakage substantially the same as a charge leakage of NVM cells included in the array of NVM cells.

6. The flash memory device of claim 1, wherein the at least one detection NVM cell is disposed proximate to the array of NVM cells such that a stress event to a cell included in the array of NVM cells causes charge leakage in both the at least one detection NVM cell and the NVM cell included in the array of NVM cells.

7. The flash memory device of claim 6, wherein the at least one detection NVM cell is configured to leak charge due to the stress event when the flash memory device is in a powered off state.

8. The flash memory device of claim 1, wherein the sensing circuit is configured to apply error correction to the data read out of the array of NVM cells during the read operation and wherein the sensing circuit is configured to measure the charge on the at least one detection NVM cell without applying the error correction during the stress detection operation.

9. The flash memory device of claim 1, wherein the sensing circuit is configured to initiate the measurement of the charge on the at least one detection NVM cell in response to the flash memory device changing from a powered off state to a powered on state.

10. The flash memory device of claim 1, wherein the at least one detection NVM cell and each NVM cell of the array of NVM cells has a floating-gate structure that comprises:
   a channel region;
   a source region coupled to a source line of the flash memory device;
   a drain region coupled to a bit line of the flash memory device;
   a first insulating layer disposed on the channel region;
   a floating gate disposed on the first insulating layer;
   a second insulating layer disposed on the floating gate; and
   a control gate disposed on the second insulating layer and coupled to a word line of the flash memory device.

11. A flash memory device, comprising:
   two or more arrays of non-volatile memory (NVM) cells, on a single substrate, configured to store data;
   two or more detection NVM cells disposed on the substrate proximate to the two or more arrays of non-volatile memory (NVM) cells;
   means for measuring a charge on at least one detection NVM cell of the two or more detection cells;
   means for comparing the measured charge with a threshold charge level; and
   means for triggering a refresh of the two or more arrays of NVM cells in response to the measured charge being less than the threshold charge level.

12. The flash memory device of claim 11, wherein at least one detection NVM cell, of the two or more arrays of non-volatile memory (NVM) cells is configured to have a charge leakage greater than a charge leakage of NVM cells included in the two or more arrays of NVM cells.

13. The flash memory device of claim 12, wherein each NVM cell of the two or more arrays of NVM cells is configured to include multiple charge levels for storing data and wherein at least one detection NVM cell, of the at least two or more detection NVM cells, is configured to be programmed to a charge level other than any of the multiple charge levels.

14. The flash memory device of claim 12, wherein each NVM cell of the two or more arrays of NVM cells includes a floating gate having a first size and wherein one detection NVM cell, of the two or more detection cells, includes a floating gate having a second size that is different than the first size.

15. The flash memory device of claim 12, further comprising at least one fully charged memory cell immediately adjacent to at least one detection NVM cell, of the two or more detection NVM cells configured to be fully charged, to increase charge migration out of the at least one detection NVM cell.

16. The flash memory device of claim 11, wherein the at least one detection NVM cell is configured to have a charge leakage substantially the same as a charge leakage of NVM cells included in the two or more arrays of NVM cells.

17. The flash memory device of claim 11, wherein at least one detection NVM cell of the two or more detection NVM cells is disposed proximate to at least one of the two or more NVM cells such that a stress event to the NVM cells included in the at least two or more arrays array of NVM cells causes charge leakage in both the at least one detection NVM cell and the NVM cells included in two or more arrays of NVM cells.

18. The flash memory device of claim 17, wherein at least one detection NVM cell, of the two or more detection NVM cells, is configured to leak charge due to the stress event when the flash memory device is in a powered off state.

19. The flash memory device of claim 11, further comprising:
   means for applying error correction to data read out of at least one of the two or more arrays of NVM cells during a read operation; and
   means for measuring the charge on at least one of the two or more detection NVM cells without applying the error correction during a stress detection operation.

20. The flash memory device of claim 11, further comprising:
   means for initiating the measurement of the charge on at least one of the two or more detection NVM cells in response to the flash memory device changing from a powered off state to a powered on state.

21. The flash memory device of claim 11, wherein at least one detection NVM cell of the two or more detection cells and each NVM cell of at least one of the two or more arrays of NVM arrays has a floating-gate structure that comprises:
   a channel region;
   a source region coupled to a source line of the flash memory device;

a drain region coupled to a bit line of the flash memory device;
a first insulating layer disposed on the channel region;
a floating gate disposed on the first insulating layer;
a second insulating layer disposed on the floating gate; and
a control gate disposed on the second insulating layer and coupled to a word line of the flash memory device.

22. A method for use with a flash memory device, wherein the flash memory device comprises an array of non-volatile memory (NVM) cells configured to store data and at least one detection NVM cell, the method comprising:
measuring a charge on the at least one detection NVM cell;
comparing the measured charge with a threshold charge level;
triggering a refresh of the array of NVM cells in response to the measured charge being less than the threshold charge level;
applying error correction to the data read out of the array of NVM cells, by a sensing circuit, during a read operation; and
measuring the charge on the at least one detection NVM cell, by the sensing circuit, without applying the error correction during a stress detection operation.

23. The method of claim 22, wherein the at least one detection NVM cell is configured to have a charge leakage greater than a charge leakage of NVM cells included in the array of NVM cells.

24. The method of claim 22, further comprising:
initiating the measurement of the charge on the at least one detection NVM cell in response to the flash memory device changing from a powered off state to a powered on state.

25. A flash memory device, comprising:
a plurality of non-volatile memory (NVM) cells, on a single substrate, arranged into at least a first block of NVM cells and a second block of NVM cells on the single substrate, wherein the plurality of NVM cells are configured to store data;
a first detection NVM cell disposed proximate to the first block of NVM cells;
a second detection NVM cell disposed proximate to the second block of NVM cells;
a sensing circuit coupled to the first detection NVM cell and to the second detection NVM cell, wherein the sensing circuit is configured to:
measure a first charge on the first detection NVM cell;
measure a second charge on the second detection NVM cell;
compare the first charge with a first threshold charge level associated with the first block of NVM cells;
compare the second charge with a second threshold charge level associated with the second block of NVM cells;
trigger a refresh of the first block of NVM cells in response to the first charge being less than the first threshold charge level; and
trigger a refresh of the second block of NVM cells in response to the second charge being less than the second threshold charge level.

26. The flash memory device of claim 25, wherein:
the first detection NVM cell is configured to have a charge leakage greater than a charge leakage of NVM cells included in the first block of NVM cells; and
the second detection NVM cell is configured to have a charge leakage greater than a charge leakage of NVM cells included in the second block of NVM cells.

27. The flash memory device of claim 26, wherein the first detection NVM cell, the second detection NVM cell, each NVM cell of the first block of NVM cells, and each NVM cell of the second block of NVM cells has a floating-gate structure that comprises:
a channel region;
a source region coupled to a source line of the flash memory device;
a drain region coupled to a bit line of the flash memory device;
a first insulating layer disposed on the channel region;
a floating gate disposed on the first insulating layer;
a second insulating layer disposed on the floating gate; and
a control gate disposed on the second insulating layer and coupled to a word line of the flash memory device.

* * * * *